Figure 1:
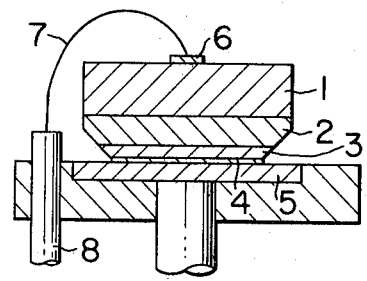

United States Patent [19]

Yamanaka et al.

[11] 4,080,245
[45] Mar. 21, 1978

[54] PROCESS FOR MANUFACTURING A GALLIUM PHOSPHIDE ELECTROLUMINESCENT DEVICE

[75] Inventors: Haruyoshi Yamanaka, Itami; Tamotsu Uragaki, Suita; Shohei Fujiwara; Morio Inoue, both of Takatsuki, all of Japan

[73] Assignee: Matsushita Electric Industrial Co., Ltd., Osaka, Japan

[21] Appl. No.: 695,442

[22] Filed: Jun. 14, 1976

[30] Foreign Application Priority Data

Jun. 17, 1975 Japan .................................. 50-74187

[51] Int. Cl.² ................. H01L 21/225; H01L 21/308; H01L 33/00; H01S 3/19
[52] U.S. Cl. .................................... 156/647; 156/649; 156/656; 156/662; 357/17; 357/60
[58] Field of Search ............... 156/633, 647, 648, 649, 156/656, 662; 357/60, 17

[56] References Cited

U.S. PATENT DOCUMENTS

| | | | |
|---|---|---|---|
| 2,890,159 | 6/1959 | Amaya | 156/648 X |
| 3,042,565 | 7/1962 | Lehovec | 156/649 X |
| 3,110,849 | 11/1963 | Soltys | 156/648 X |
| 3,135,638 | 6/1964 | Cheney et al. | 156/649 |
| 3,260,633 | 7/1966 | Seiter | 156/648 |
| 3,287,186 | 11/1966 | Minton et al. | 156/648 X |
| 3,522,043 | 7/1970 | Vitkus | 156/648 X |
| 3,752,714 | 8/1973 | Kazuhiro et al. | 156/647 X |
| 3,775,201 | 11/1973 | Basi | 156/647 X |
| 3,808,058 | 4/1974 | Henning | 156/649 X |
| 3,819,433 | 6/1974 | Bowman | 156/649 X |
| 4,007,104 | 2/1977 | Summers et al. | 156/649 X |
| 4,011,113 | 3/1977 | Thompson et al. | 156/648 X |
| 4,013,502 | 3/1977 | Staples | 156/656 X |
| 4,017,880 | 4/1977 | Kasami et al. | 357/17 |
| 4,028,140 | 6/1977 | Summers et al. | 156/649 X |
| 4,029,531 | 6/1977 | Marinelli | 156/647 |
| 4,029,542 | 6/1977 | Swartz | 156/649 |
| 4,032,951 | 6/1977 | Dewinter | 357/17 |
| 4,035,607 | 7/1977 | Wu | 156/647 |

Primary Examiner—Harold Ansher
Attorney, Agent, or Firm—Stevens, Davis, Miller & Mosher

[57] ABSTRACT

When gallium phosphide is etched with hot phosphoric acid from the surface of a crystal having a ($\bar{1}\,\bar{1}\,\bar{1}$) plane, the etched surface becomes a flat and smooth plane inclined at an angle of 45° to 55° to the ($\bar{1}\,\bar{1}\,\bar{1}$) plane. Accordingly, when an electroluminescent diode is manufactured by forming a p-n junction on a gallium phosphide crystal having a ($\bar{1}\,\bar{1}\,\bar{1}$) plane and etching the crystal with a hot concentrated phosphoric acid etching solution to form a mesa structure, the side faces of the resulting crystal becomes inclined to the plane of the junction at an angle of nearly 45° so that the visible rays generated in the p-n junction are totally reflected on the side faces, thus markedly increasing the intensity of emitted rays in the direction of the optical axis perpendicular to the principal plane of the p-n junction.

7 Claims, 7 Drawing Figures

PROCESS FOR MANUFACTURING A GALLIUM PHOSPHIDE ELECTROLUMINESCENT DEVICE

This invention relates to an improved solid state electroluminescent device utilizing a gallium phosphide (GaP) crystal and to a method of manufacturing the same.

Solid state electroluminescent devices have been in practical use through utilization of crystals of compounds of Groups III to V elements, such as gallium arsenide, above-noted GaP, or gallium arsenide-phosphide which is a mixed crystal of gallium arsenide and gallium phosphide. The luminescence of all of these solid state devices is an injection-type electroluminescence emitted from a p-n junction of the above crystals. Particularly, the luminescent element utilizing a p-n junction of GaP, which is the subject of this invention, has a forbidden band range of 2.26 eV in the crystal at room temperature and when electrons and positive holes recombine through impurity centers, etc., visible rays varying from red to green are emitted. For example, it has been known that a typical luminescence spectrum at room temperature of a GaP luminescent element (p-n junction diode) containing as impurities zinc (Zn), nitrogen (N), oxygen (O), sulfur (S), etc., consists of green luminescence with a peak at about 560 nm, red luminescence with a peak at about 700 nm, and infrared luminescence with a peak at about 980 nm according to the combination of the above impurities.

In order to improve the emission efficiency of the solid state luminescent device, it is important to increase the efficiency of luminescent recombination in the region of the p-n junction of the crystal as well as to let the luminescence efficiently emerge from the inside of the crystal.

The chips of luminescent material are obtained usually by the so-called dicing technique which is used in cutting a large wafer into a great number of pieces. However, since the conventional dicing is carried out chiefly by either utilizing a cutting tool to cut apart the wafer mechanically or exposing the wafer along the cutting line to an intense laser beam to be cut apart by melting, such processing inevitably leaves behind strains at the edges of the chip, leading to deterioration in emission characteristics.

Although chemical etching has been carried out subsequent to dicing to remove the residual strain at the edges of the chip, no suitable etching agent is known except for aqua regia and even aqua regia is not entirely satisfactory because it does not produce an etch surface sufficiently flat for the optical element or eliminate completely the strain caused by the cutting treatment.

It is possible to effect dicing directly by chemical etching, but no chemical etching procedure is known at present to produce a flat etch surface of the chip.

The main object of this invention is to provide a GaP electroluminescent device of mesa structure, which may efficiently send the luminescence in a p-n junction region out of the crystal. The present luminescent device has such a construction that side faces of the crystal are flat planes inclined at a prescribed angle to the principal plane of the p-n junction so that the visible rays generated in the region of the p-n junction may be totally reflected at the flat side faces and concentrate in the direction perpendicular to the principal plane of the p-n junction.

Another object of this invention is to provide a simple method which permits steady manufacture of the present GaP electroluminescent device.

In the accompanying drawings:

FIG. 1 is a simplified sectional view of the present electroluminescent device.

FIGS. 2(a) – 2(e), inclusive, constitute a simplified flow chart illustrating the procedure for manufacturing the present electroluminescent device.

Figure 3:
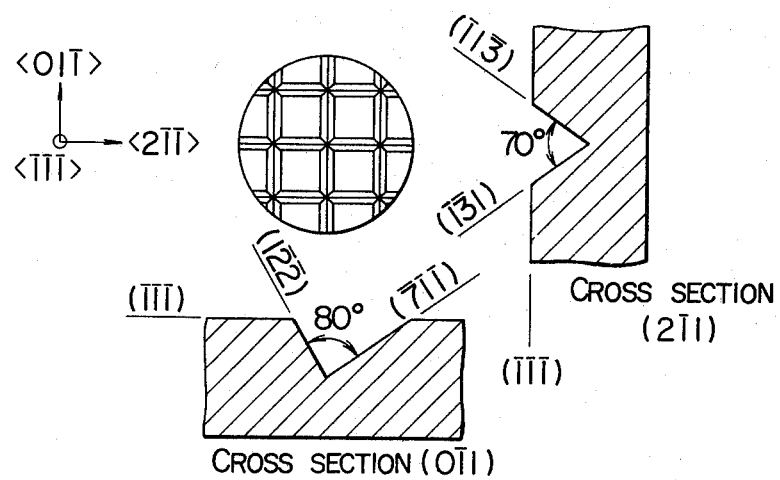

FIG. 3 shows examples of crystallographic planes of the present electroluminescent device.

In FIG. 1 is shown an example of the preferred embodiment of this invention, in which an epitaxial layer 2 of n-type GaP is formed by a liquid phase crystal growth technique on the surface of an N$^+$-type GaP wafer 1 having (1 1 1)B planes, i.e. ($\bar{1}$ $\bar{1}$ $\bar{1}$) planes, and then the outermost part of the epitaxial layer is transformed by impurity diffusion into a p-type region 3 which is subsequently bonded at the surface onto a metal stem lead 5 with interposed membrane electrode 4 made mainly of gold. The resulting semiconductor element produces luminescence in its p-n junction on application of a foward potential to the p-n junction through the electrode 6 on the n$^+$-type GaP wafer 1, a connecting lead wire 7, a stem lead 8, and the stem lead 5. The side faces of the semiconductor element, that is, the inclined side faces of the n-type epitaxial layer 2 and the p-type region 3 are joined to the principal plane of the p-n junction at an angle of about 45° to 50°. Being flat and smooth, this inclined face is able to reflect totally the visible rays generated in the region of the p-n junction toward the inside of the crystal and to converge in the direction of the optical axis perpendicular to the upper surface of the crystal. By taking into account the refractive index of the GaP crystal of about 3.5 and the critical angle at the interface between the air and the crystal surface of 17°, it is apparent that the inclination of the side faces of the crystal is sufficient for sending by total reflection the visible rays generated in the region of the p-n junction in the direction of the above-noted optical axis. Accordingly, by having the side faces of the GaP crystal joined to the principal plane of the p-n junction at an angle less than 73°, the device of the present example is capable of converging the emission of the p-n junction in the direction of the optical axis, manifesting desirable luminance as an electroluminescent display device.

Figure 2A:
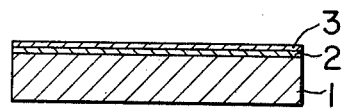

FIGS. 2(a) – 2(e), inclusive, constitute a flow chart of the procedure for manufacturing the electroluminescent device shown in FIG. 1. First, a GaP crystal with p-n junction is prepared to form the base of a luminescent element (FIG. 2a). This GaP crystal consists of an n$^+$-type wafer 1 with crystal surface of (1 1 1)B, i.e. ($\bar{1}$ $\bar{1}$ $\bar{1}$) plane, provided with an epitaxial layer 2 of the n-type GaP, the surface layer of which is transformed into a p-type region 3 by impurity diffusion. The thickness of the n-type epitaxial layer 2 in the case of a luminescent element is about 50 μm and the depth of junction, that is, the thickness of the p-type region 3, is around 10 μm.

Figure 2B:
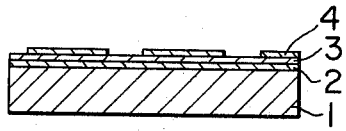

Next, the surface of the thus obtained GaP crystal is provided with a great number of rectangular pieces of gold film 4 (FIG. 2b). It is desirable to form the pieces of gold film 4 by first depositing gold film from the vapor phase all over the surface of the GaP crystal and then etching the unnecessary areas by the well-known photographic etching technique to form a prescribed pattern. Alternatively, if high precision is not required, it is possible to deposit gold over the crystal surface covered with a mask honing a net-like pattern (so-called masked deposition). The gold film 4 can be used as a contact electrode by selecting a metal capable of forming an ohmic contact with the GaP crystal.

Figure 2C:
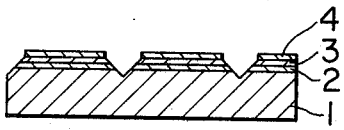
Figure 2D:
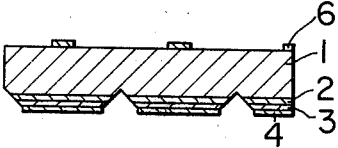

Subsequently, the resulting GaP crystal provided with pieces of gold film 4 is brought into contact with a concentrated phosphoric acid solution maintained at a temperature of 130° to 220° C to etch the unmasked areas of the crystal by utilizing the gold film 4 as a mask, resulting in etched grooves having a V-shaped crosssection (FIG. 2c). Although the depth of this V-shaped groove depends on the distance between adjacent pieces of gold film 4 and the time of etching treatment, it should reach beyond the region of the p-n junction. In actual operation, the etched V-shaped groove is made deep enough to permit easy scribing along the groove.

Figure 2E:
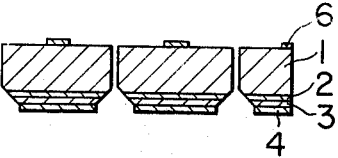

After the opposite surface of the GaP crystal, that is, the exposed surface of the $n^+$-type wafer 1 has been provided with small pieces of metal film 6 serving as electrodes, the crystal is pressed on the side of the $n^+$-type wafer 1 by means of a pressing tool such as a roller to separate the crystal along the etched grooves to obtain individual elements of trapezoidal or mesa structure (FIG. 2e).

In etching the GaP crystal in the above manufacturing procedure, it is recommendable from experience to use an aqueous solution containing 70% or more of phosphoric acid ($H_3PO_4$). The most desirable results are obtained when the concentration of phosphoric acid in the aqueous solution is 90% and the temperature of the solution is 150° to 180° C, the etching rate being about 10 μm per minute.

The etching with a phosphoric acid solution depends markedly on the type of crystallographic plane. The etch front of the V-shaped groove formed by etching from the $(\bar{1}\ \bar{1}\ \bar{1})$ plane of the GaP crystal shows a constant profile. When a number of rectangular masks are placed on the $(\bar{1}\ \bar{1}\ \bar{1})$ plane so that unmasked areas in the pattern of rectangular lattice-work extending in both directions of $<0\ 1\ \bar{1}>$ and $<2\ \bar{1}\ \bar{1}>$ may be formed, as shown in FIG. 3, and the unmasked areas are etched, there are formed V-shaped grooves running in both directions. The groove running in the direction of the $<0\ 1\ \bar{1}>$ plane shows a profile in an unsymmetric V-shape and the exposed etched surfaces are in the $(1\ \bar{2}\ \bar{2})$ plane and $(7\ \bar{1}\ \bar{1})$ plane (a vertical angle of 80°). The groove running in the direction of $<2\ \bar{1}\ \bar{1}>$ shows a profile of symmetric V-shape and the exposed etched surfaces are in the $(\bar{1}\ \bar{3}\ 1)$ and $(\bar{1}\ 1\ \bar{3})$ planes (a vertical angle of 70°). The etch front of these V-shaped grooves is a very flat and smooth surface having uniform depth and width and shows excellent reproducibility.

The etch front to the $(\bar{1}\ \bar{1}\ \bar{1})$ plane of the GaP crystal contains specific crystallographic planes such as the $\bar{1}\ \bar{2}\ \bar{2}$ group, the $\bar{7}\ \bar{1}\ \bar{1}$ group, or the $\bar{1}\ \bar{3}\ \bar{1}$ group and forms a V-shaped groove having a vertical angle of 70° to 80°. Consequently, in forming an element of a mesa structure a deep undercut (so-called under-etch) beneath the mask may be avoided and a mesa structure of even quality may by obtained.

By comparison of emission characteristics of the present GaP luminescent device (p-n junction diode) with those of a conventional luminescent mesa diode having side faces nearly perpendicular to the principal plane of p-n junction, it has been confirmed that the present luminescent device is improved by about 100% in intensity of emission in the direction of the optical axis (i.e. the direction perpendicular to the principal plane of the p-n junction) and by about 30% in total emission output on account of reduced irregular internal reflection.

According to this invention, contrary to the case of conventional mechanical processing, no strain is developed in separating (by scribing) into individual mesa elements and, hence, the deterioration in characteristics caused by processing is eliminated, thus contributing to uniformity in emission characteristics.

In the above example, the present device and the manufacturing method thereof are illustrated by referring to a mesa structure in the form of a truncated tetrahedral pyramid manufactured by use of a rectangular mask. The manufacturing procedure may be applied to any truncated polyhedral pyramid. Also, the formation of p-n junction is illustrated in the above example by referring to the p-type region 3 formed by injecting an impurity such as zinc into the n-type epitaxial layer 2. It is also possible to form the p-type region 3 by the liquid phase epitaxial growth technique.

What is claimed is:

1. A method for manufacturing a gallium phosphide electroluminescent device, characterized by providing an anticorrosive polygonal plane mask on the surface of a gallium phosphide crystal containing $(\bar{1}\ \bar{1}\ \bar{1})$ planes, and etching the crystal from exposed areas with an aqueous solution consisting essentially of hot concentrated phosphoric acid to form a mesa structure in the form of a truncated polyhedral pyramid.

2. A method according to claim 1, wherein the concentrated phosphoric acid solution contains 70% or more of phosphoric acid.

3. A method according to claim 1, wherein the concentrated phosphoric acid solution is maintained at a temperature in the range of 130° to 220° C, preferably 150° to 180° C.

4. A method according to claim 1, wherein the anticorrosive mask is a metallic film consisting mainly of gold, which is in ohmic contact with the gallium phosphide crystal.

5. A method of manufacturing a gallium phosphide electroluminescent device comprising the steps of
   forming an epitaxial layer of gallium phosphide having a given conductivity type on the surface of a gallium phosphide wafer having a $(\bar{1}\ \bar{1}\ \bar{1})$ plane,
   diffusing an impurity into the surface of said epitaxial layer remote from said gallium phosphide wafer to form a region therein having a conductivity type opposite to that of said epitaxial layer,
   depositing a conductive film on selected portions of said opposite conductivity type region in ohmic contact therewith to form a rectangular mask defining unmasked exposed regions, and
   etching said opposite conductivity type region and epitaxial layer at said exposed region with an aqueous solution consisting essentially of phosphoric acid to form a mesa structure in the form of a truncated polyhedral pyramid, the inclined side faces of said pyramid forming flat and smooth planes inclined at an angle of 45° to 55° to said $(\bar{1}\ \bar{1}\ \bar{1})$ plane.

6. A method according to claim 5, wherein said aqueous solution contains at least 70% phosphoric acid and its temperature is in the range 130° to 220° C.

7. A method according to claim 6, wherein said aqueous solution contains approximately 90% phosphoric acid and its temperature is in the range 150° to 180° C.

* * * * *